United States Patent
Redecker et al.

(10) Patent No.: US 7,492,094 B2
(45) Date of Patent: Feb. 17, 2009

(54) PHOTOLUMINESCENCE QUENCHING DEVICE AND DISPLAY USING PHOTOLUMINESCENCE QUENCHING DEVICES

(75) Inventors: Michael Redecker, Berlin (DE); Joerg Fischer, Berlin (DE)

(73) Assignee: Samsung SDI Co., Ltd., Suwon (KR)

(*) Notice: Subject to any disclaimer, the term of this patent is extended or adjusted under 35 U.S.C. 154(b) by 274 days.

(21) Appl. No.: 10/779,707

(22) Filed: Feb. 18, 2004

(65) Prior Publication Data

US 2004/0227143 A1   Nov. 18, 2004

(30) Foreign Application Priority Data

May 15, 2003   (EP) .................................. 03090139
Aug. 2, 2003   (KR) ...................... 10-2003-0053589

(51) Int. Cl.
*H01J 1/62* (2006.01)
*B32B 9/00* (2006.01)

(52) U.S. Cl. ....................................... 313/506; 428/690

(58) Field of Classification Search ......... 313/503–506, 313/509, 512; 428/690
See application file for complete search history.

(56) References Cited

U.S. PATENT DOCUMENTS

| | | | |
|---|---|---|---|
| 5,294,810 A | 3/1994 | Egusa et al. | 257/40 |
| 6,097,147 A | 8/2000 | Baldo et al. | 313/506 |
| 2002/0027537 A1 | 3/2002 | Redecker | |
| 2002/0055015 A1 | 5/2002 | Sato et al. | |
| 2003/0059647 A1* | 3/2003 | Thompson et al. | 428/690 |
| 2004/0227143 A1* | 11/2004 | Redecker et al. | 257/80 |

FOREIGN PATENT DOCUMENTS

| | | |
|---|---|---|
| DE | 100 42 974 A 1 | 3/2002 |
| EP | 1083612 | 3/2001 |

(Continued)

OTHER PUBLICATIONS

Y. Ohmori., et al., "Multi-Color Emission Organic EL Diode with Vapor Deposited Multi-Layer Structure", Lasers and Electro-Optics Society Annual Meeting, 1996. Leos 96., IEEE Boston, MA, USA, Nov. 18-19, 1996, New York, NY, Nov. 18, 1996, p. 84-85.

(Continued)

*Primary Examiner*—Peter Macchiarolo
(74) *Attorney, Agent, or Firm*—H.C. Park & Associates, PLC

(57) ABSTRACT

A display having a hole barrier layer and/or a electron barrier layer, whereby the hole barrier layer and/or the electron barrier layer are disposed between an emitter layer and a first electrode layer or a second electrode layer of the display. The highest occupied molecule orbital of the hole barrier layer is energetically lower than highest occupied molecule orbital of the emitter layer and/or the lowest unoccupied molecule orbital of the electron barrier layer is energetically higher than the lowest unoccupied molecule orbital of the emitter layer. By arranging the energy levels of the molecule orbitals of the hole barrier layer and/or the electron barrier layer, barriers can be created to prevent the injection of unwanted charge carriers in the reverse direction during re-emissive operation of the display.

7 Claims, 3 Drawing Sheets

FOREIGN PATENT DOCUMENTS

| | | |
|---|---|---|
| KR | 10-2001-0077989 | 8/2001 |
| KR | 10-2002-0055418 | 7/2002 |
| WO | 9747050 | 12/1997 |
| WO | 01-24290 | 4/2001 |
| WO | 0166618 | 9/2001 |
| WO | 03021340 | 3/2003 |
| WO | WO 03/022008 A1 | 3/2003 |

OTHER PUBLICATIONS

R. Young, et al., "Current-Induced Fluorescence Quenching in Organic Light-Emitting Diodes", Applied Physics Letters, AIP, American Institute of Physics, Melville, NY, US, Feb. 4, 2002, p. 874-876.

European Search Report dated Nov. 28, 2007.

* cited by examiner

PHOTOLUMINESCENCE QUENCHING DEVICE AND DISPLAY USING PHOTOLUMINESCENCE QUENCHING DEVICES

CROSS-REFERENCE TO RELATED APPLICATION

This application claims the priority of European Patent Application No. 03 090 139.1 filed on May 15, 2003, in the European Patent Office, the disclosure of which is incorporated herein in its entirety by reference.

BACKGROUND OF THE INVENTION

1. Field of the Invention

The invention relates to a photoluminescence quenching device (PQD) which can be driven in an emissive mode to convert signal voltages into light and in a re-emissive mode to suppress a photoluminescent emission, a display based on photoluminescence quenching devices (PQD) and a process to convert signal voltages into optical picture information.

2. Description of the Related Art

Flat displays based on organic light emitting diodes (OLEDs) glow brightly and have a wide viewing angle. Self-emissive OLED-displays do not require background lighting and can be implemented such that the display energetically functions favorably in conditions with low or medium amounts of ambient light.

Under conditions with large amounts of ambient light, e.g. in direct sunlight, however, in self-emissive OLED-displays, a relatively large amount of power is required to attain the appropriate brightness. Furthermore, the required currents needed to control the emissive components are accordingly high. Therefore, in this regard, reflective and re-emissive technologies like liquid crystal displays are superior to self-emissive OLED-displays. The disadvantage of reflective and re-emissive technologies is, however, that they require a backlight for operation in conditions with little ambient light, which in turn over proportionately increases energy consumption and the form parameters.

Devices which are based on organic light emitting diodes and which operate in an emissive mode as well as a re-emissive mode are disclosed in DE 100 42 974 A1. Such a photoluminescence quenching device (PQD) has a structure which is similar to an organic light emitting diode and can operate in both the self-emissive mode, i.e. without ambient light, as well as in the re-emissive mode. In the re-emissive mode, the intensity of the photoluminescent light is controlled by applying a voltage in the inverse direction of the PQD. Appropriately selecting contact and emitter materials enables the device to operate in the emissive mode as well as in the re-emissive mode. A further advantage is that the device does not require a backlight. A condition for the re-emissive operation is that enough ambient light can be absorbed from the surroundings. It is also necessary to be able to apply positive and negative gate voltages to the display element.

In their basic structure, photoluminescence quenching devices consist of a transparent and conducting contact, an emitter layer, and an opposing contact. To regulate the brightness of the display element the metal contact (i.e., opposing contact) is positively charged in relation to the transparent contact and this corresponds to the inverse direction (re-emissive operation). This structure does, however, have limits in regards to efficiency while in re-emissive operation, since the injection barrier is also finite in the inverse direction and consequently noticeable dark currents flow. These dark currents diminish the energy balance, especially when the display is operated with low brightness. Furthermore, the metal contact must be a base metal like aluminium or calcium, which require a complex encapsulation to protect the contact from corrosion.

It is known from U.S. Pat. Nos. 5,294,810 and 6,097,147, that multiple layer structures can improve the energy balance. These structures are optimized for optimal performance in emissive operation of the light emitting diode, i.e. for optimal injection of charge carriers. Likewise, it is known that the application of inorganic materials in organic light emitting diodes improves the injection of electrons during emissive operation.

Moreover, EP 1 083 612 describes the application of fluorides and oxides of alkali metals and alkaline-earth metals to improve electron injection. All known multi layer systems for organic light emitting diodes, however, only realize a favorable injection of electrons in the emissive mode. With the currently known devices it is not possible to reduce the electron injection for re-emissive operation of a light emitting diode.

SUMMARY OF THE INVENTION

This invention provides a photoluminescence quenching device which can be driven in an emissive mode to convert signal voltages into light and in a re-emissive mode to suppress a photoluminescent emission. This invention separately provides a display based on photoluminescence quenching devices (PQD) which exhibit very little dark current during re-emissive operation, and a process to convert signal voltages into optical picture information. Thereby, the efficiency of the display or the PQD at low brightness shall be increased.

The invention separately provides a display with a photoluminescence quenching device (PQD) comprising a substrate, a first electrode layer which is transparent and is arranged on the front side of the emitter layer, an emitter layer, and a second electrode layer, which is disposed on the backside of the emitter layer. The display comprises a hole barrier layer and/or an electron barrier layer, where the hole barrier layer and/or the electron barrier layer are disposed between the emitter layer and the first electrode layer or the second electrode layer. The highest occupied molecule orbital of the hole barrier layer is energetically lower than the highest occupied molecule orbital of the emitter layer and/or the lowest unoccupied molecule orbital of the electron barrier layer is energetically higher than the lowest unoccupied molecule orbital of the emitter layer.

In another exemplary embodiment of the invention, there is provided a photoluminescence quenching device (PQD), comprising a first electrode which is transparent and located on the front side of the organic material, organic light emitting material and a second electrode which is located on the back side of the organic material. The PQD comprises a hole barrier layer and/or an electron barrier layer disposed between the light emitting material and the first electrode or the second electrode. The highest occupied molecule orbital of the hole barrier layer is energetically lower than the highest occupied molecule orbital of the light emitting material and/or the lowest unoccupied molecule orbital of the electron barrier layer is energetically higher than the lowest unoccupied molecule orbital of the light emitting material.

In still another aspect of the invention, there is provided a method for converting signal voltages into optical picture information. The method comprises utilizing a display based on photoluminescence quenching devices (PQD), which can be operated in a re-emissive mode to suppress a photoluminescent emission. Freely mobile electrons at the cathode are prevented from moving in the direction of the anode by an electron barrier layer and/or the movement of the electron deficient regions at the anode in the direction of the cathode is prevented by a hole barrier layer.

BRIEF DESCRIPTION OF THE DRAWINGS

The above and other features and advantages of the invention will become more apparent by describing in detail exemplary embodiments thereof with reference to the attached drawings.

DETAILED DESCRIPTION OF THE INVENTION

Figure 1:
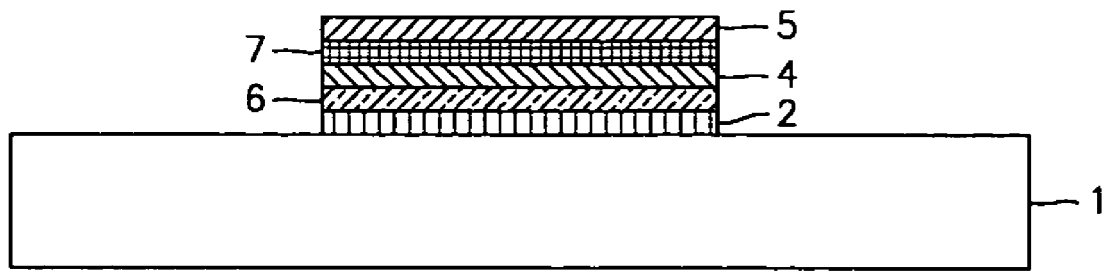
FIG. 1 shows a schematic sectioned illustration of a display according to the invention with an electron barrier layer and a hole barrier layer.

In an exemplary embodiment of the invention, the LUMO of the emitter layer corresponds to the LUMO of the hole barrier layer and/or the HOMO of the electron barrier layer corresponds to the HOMO of the emitter layer, whereby the first electrode layer (the electrode layer facing the substrate) forms the cathode of the display, and the second electrode layer (the electrode layer facing away from the substrate) forms the anode during re-emissive operation. During emissive operation, the first electrode layer forms the anode and the second electrode layer forms the cathode. If the energies in the conduction band of the emitter layer and the conduction band of the hole barrier layer are substantially or entirely equal and the energies in the valence band of the emitter layer and the valence band of the electron barrier layer are substantially or entirely equal as well, then both emissive and re-emissive operation are possible.

If the energy levels of the hole barrier layer, the emitter layer and the electron barrier layer are adjusted in such a manner, that the charge carriers can drain without having to overcome barriers during re-emissive operation but having to overcome barriers for the injection during emissive operation, then only re-emissive operation is possible.

In this case the choice of materials for the metal contact is not limited to base metals, so materials that are more resistant to corrosion can be used. By having the freedom to choose the electrode material, inverted layer structures can be produced, in which a transparent contact takes over the role of the metal contact and serves to extract electrons. During re-emissive operation, the transparent contact is then positively polarized in relation to the metal contact without a charge carrier injection taking place. Furthermore, there should be an adequate distance between the HOMO and LUMO (so called band gap). To maximize the barriers for charge carrier injection in the reverse direction, the band gap should be large enough for the electron barrier layer as well as the hole barrier layer. Preferably, the energy difference between the HOMO (10) of the electron barrier layer (6) and the LUMO (11) of the electron barrier layer (6) and the energy difference between the HOMO (12) of the hole barrier layer (7) and the LUMO (13) of the hole barrier layer (7) each amount to at least about 3.3 eV. The corresponding materials should therefore not absorb any light in the visible spectrum.

Alternatively, it is possible, that an electrode layer consists at least in part of the hole barrier layer and/or the electron barrier layer.

Relating to the display, a photoluminescence quenching device comprises a hole barrier layer and/or an electron barrier layer, whereby the valence band of the hole barrier layer is energetically lower than the valence band of the light emitting material of the PQD and/or the conduction band of the electron barrier layer is energetically higher than the conduction band of the light emitting material of the PQD.

Figure 2:
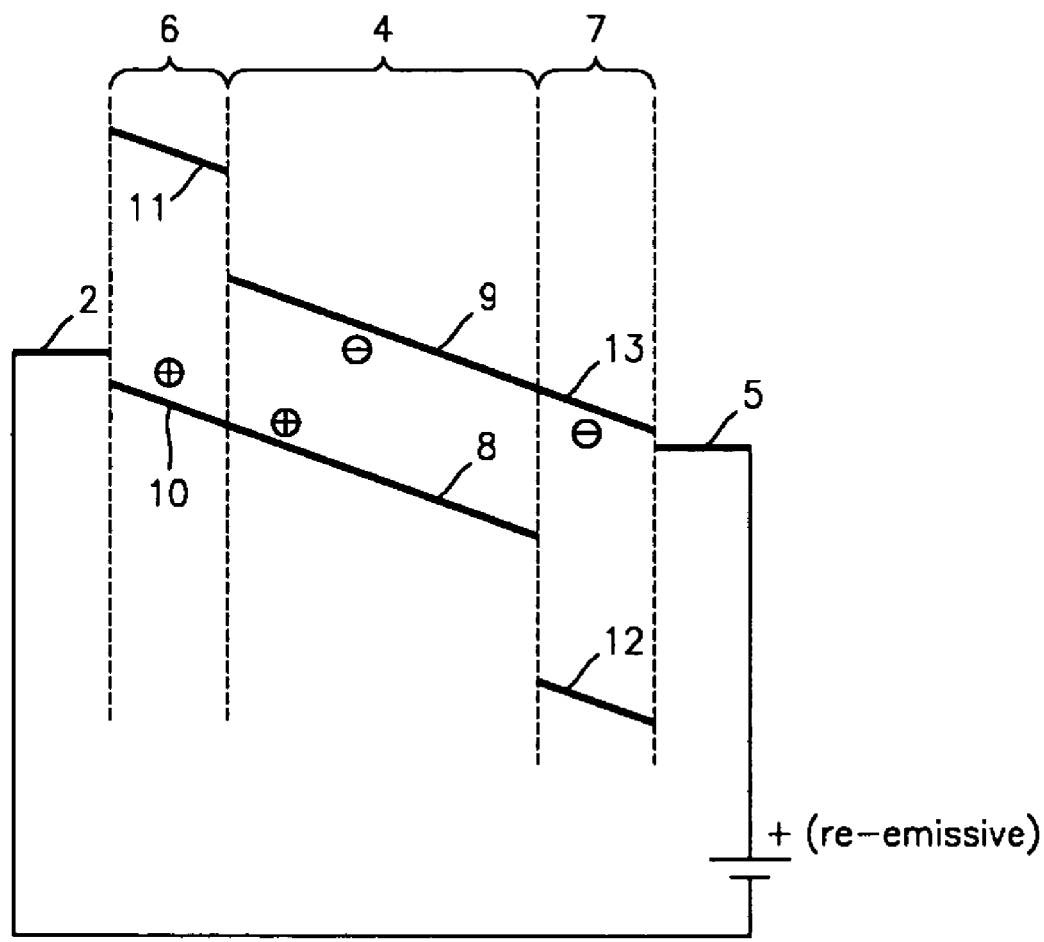
FIG. 2 is a schematic sectioned illustration of the energy states of the valence band and the conduction band of each of the electron barrier layer, the emitter layer and the hole barrier layer of a display, which can be toggled between emissive operation and re-emissive operation.

FIG. 1 shows an exemplary display according to the invention depicted in a schematic sectioned view. A transparent contact 2 is placed on the glass substrate 1. This transparent contact 2 forms the anode during emissive operation and the cathode during re-emissive operation of the display. An electron barrier layer 6 is placed on the layer of the transparent contact 2. The organic emitter layer 4 is disposed on the electron barrier layer 6 and the hole barrier layer 7 is disposed on the organic emitter layer 4. The display also includes a metal contact layer 5 with a small work function. To reduce the dark current going in the reverse direction during emissive operation, the materials of the emitter layer 4, electron barrier layer 6 and the hole barrier layer 7 are selected so that the energy levels of the valence band and the conduction band of the emitter, electron barrier and hole barrier layers 4, 6 and 7 act according to FIG. 2.

The materials of the electron barrier layer 6, the hole barrier layer 7 and the emitter layer 4 are selected in such a manner, that the conduction band 9 (lowest unoccupied molecule orbital) of the emitter layer corresponds to the conduction band 13 of the hole barrier layer 7 and the valence band 8 (highest occupied molecule orbital) of the emitter layer 4 corresponds to the valence band 10 of the electron barrier layer 6. Furthermore, the conduction band 11 of the electron barrier layer 6 is energetically higher than the conduction band 9 of the emitter layer 4 and the valence band 8 of the emitter layer 4 is energetically higher than the valence band 12 of the hole barrier layer 7. Through this adaptation it becomes possible for the charge carriers that are created in the emitter layer to drain without barriers. As a result, the emissive as well as the re-emissive operation of the display are made possible.

Figure 3:
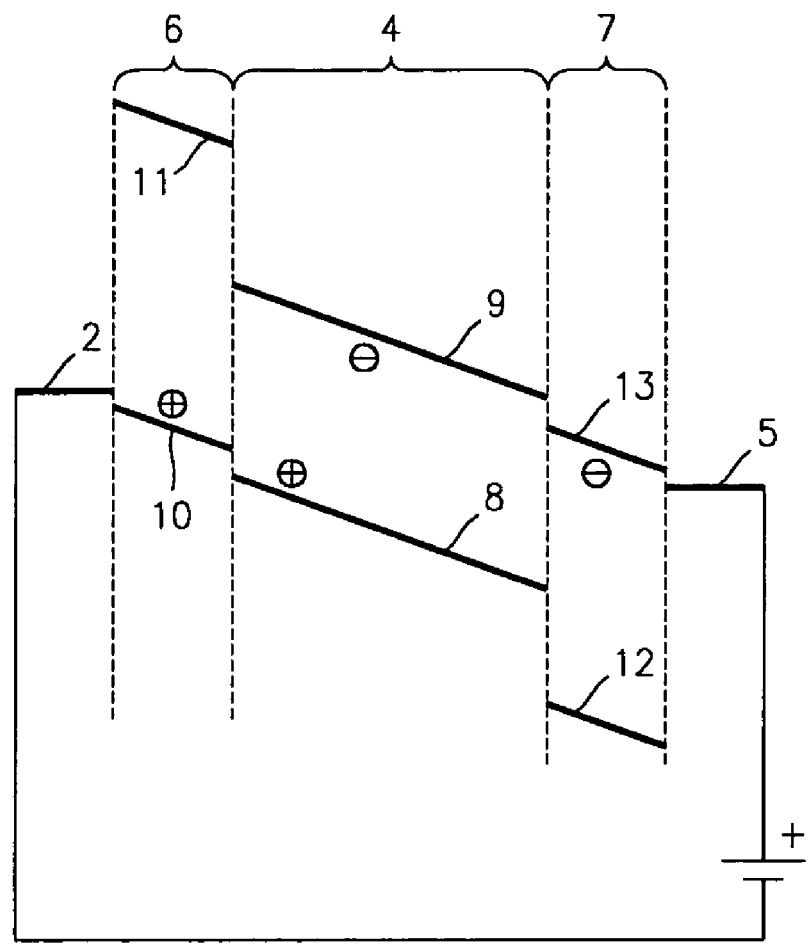
FIG. 3 is a schematic sectioned illustration of the energy states of the valence band and conduction band of the electron barrier layer, emitter layer, and hole barrier layer for a display, which can be driven in re-emissive operation.

If the display is merely to be used in re-emissive operation for an application, in an exemplary embodiment of the invention, that the conduction band 9 of the emitter layer is energetically higher than the conduction band 13 of the hole barrier layer 7. Further, the valence band 10 of the electron barrier layer 6 is energetically higher than the valence band 8 of the emitter layer 4, as shown schematically in FIG. 3. In this case no forward operation is possible due to the barriers resulting from this arrangement. In this exemplary embodiment the selection of the material for the metal contact layer 5 is not limited to base metals. Thus, materials with improved corrosion resistance can also be used. Through this, it is also possible to produce inverted layer structures, where the transparent contact takes over the role of the metal contact and serves to extract electrons. It is also possible to omit one of the barrier layers, as is done in the embodiment where only a hole barrier layer is employed. Without an injection of charge carriers during re-emissive operation the transparent contact is positively polarized with respect to the metal contact.

Organic materials with pi-conjugated electron systems, whose states of the corresponding energy levels are determined by the selection of the molecular structure, can, for example, be used as the material for the electron barrier layer 6 and the hole barrier layer 7. Appropriate material categories for the electron barrier layer 6 are amongst others triphenylamine derivatives, benzidine derivatives, and phenylenediamine derivatives. Appropriate material categories for the hole barrier layer 7 include, for example, oxadiazole derivatives, oxazole derivatives, triazole derivatives and quinoxaline derivatives as well as naphthalene carboxylic acid imide derivatives and naphthalene dicarboxylic acid diimide derivatives. Triphenylamine derivatives should be interpreted as including triphenylamine itself, benzidine derivatives should be interpreted as including triphenylamine itself, and so on. The materials can be of a low molecular as well as of a polymeric nature. The invention, however, is not limited to these materials.

Especially for the hole barrier layer 7, inorganic materials, including tin oxide, titanium oxide and zinc oxide as well as zirconium oxide, tantalum oxide, zinc sulphide and zinc selenide can be used. These materials are introduced unendowed into the layer structure and are especially beneficial for the production of inverted structures.

Figure 4:
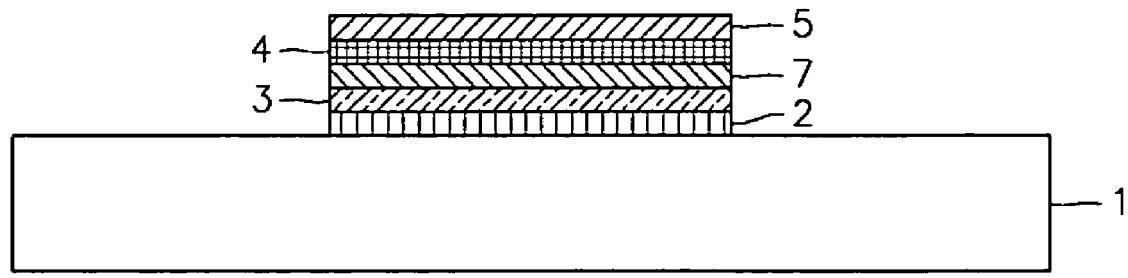
FIG. 4 is a schematic sectioned illustration of a display according to the invention with a hole barrier layer on a inorganic basis.
Figure 5:
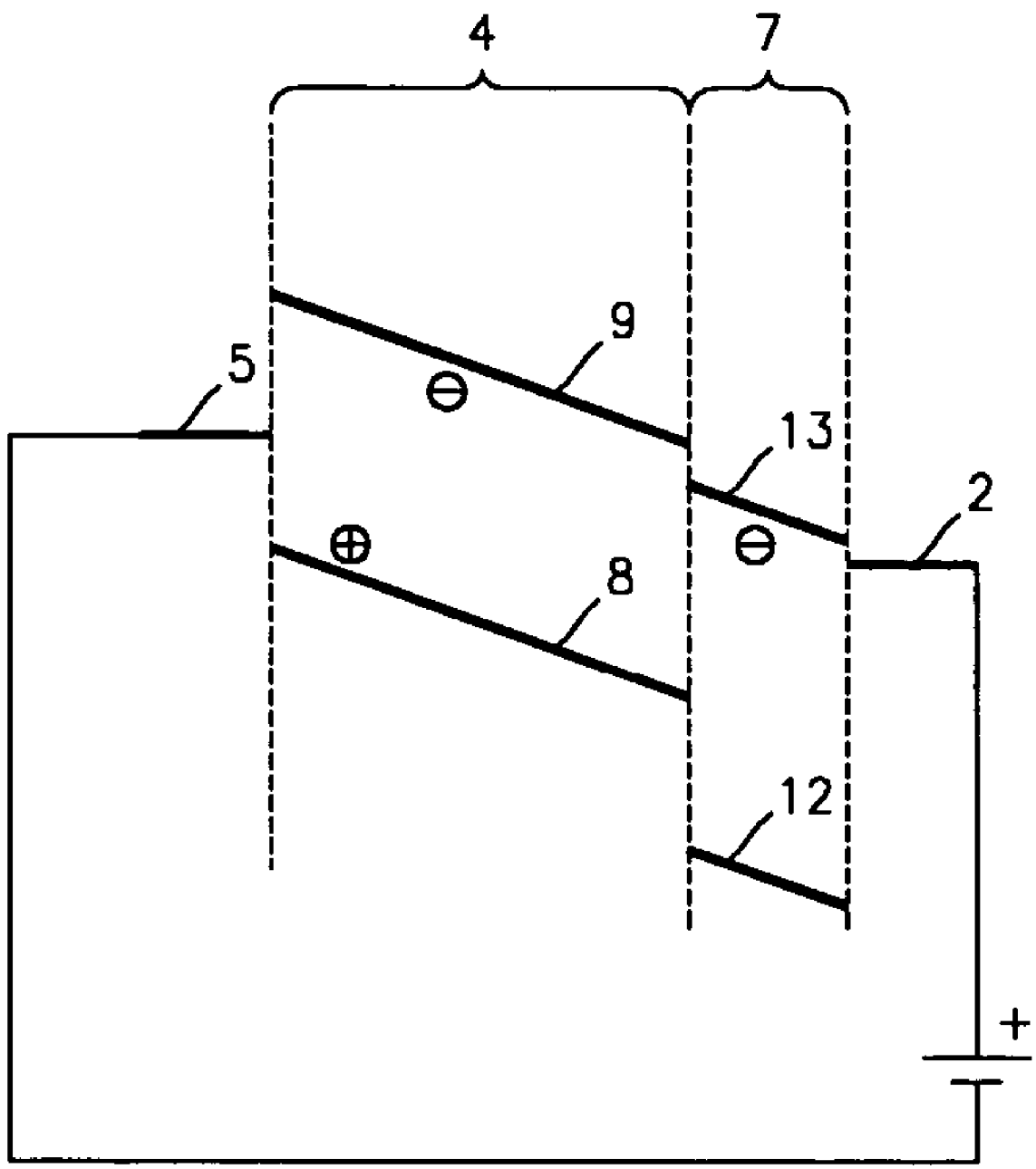
FIG. 5 is a schematic sectioned illustration of the energy states of the valence band and conduction band of the emitter layer and hole barrier layer for a display, which can be driven in re-emissive operation and which has an inverted layer structure.

FIG. 4 shows an exemplary display according to the invention, which is only intended for re-emissive operation. The corresponding energy level scheme is shown schematically in FIG. 5. The energy of the valence band 12 of the hole barrier layer 7 is energetically lower than both the valence band 8 of the emitter and of the transparent contact 2. The workfunction of the metal contact 5 is chosen to maximize the energy offset between the metal contact 5 and the conduction band 9 of the emitter layer 4.

Starting with a glass substrate 1 coated, for example, with indium-tin-oxide (layer of the transparent contact 2) the hole transport layer 3 is applied by having, for example, poly (ethylene dioxy-thiophene)/polystyrene sulfonic acid spin-coated at it with a thickness of 30-100 nm. Subsequently the hole barrier layer 7 is coated, for example, with a layer of tin-oxide $SnO_2$ by reactive vaporization in a vacuum with a thickness around 10-80 nm. For this purpose, the tin-oxide is thermally evaporated by subjecting it to a pressure of around $10^{-4}$ to $10^{-3}$ mBar. The emitter layer 4 comprises a derivative of poly(phenylenevinylene) and is applied with a thickness of 30 to 120 nm by spin-coating an organic solution of it. For the metal contact layer 5, a gold layer with a thickness of 20-100 nm is vaporized in a vacuum, where the layer 5 has a large work function. The structure is completed by a (not shown here) water and gas tight encapsulation.

The invention, for example, reduces dark currents in photoluminescence quenching devices and displays based on photoluminescence quenching devices during re-emissive operation.

According to the invention, the display comprises a hole barrier layer and/or a electron barrier layer, whereby the hole barrier layer and/or the electron barrier layer are disposed between the emitter layer and one electrode layer of the display. The highest occupied molecule orbital of the hole barrier layer is energetically lower than the highest occupied molecule orbital of the emitter layer and/or the lowest unoccupied molecule orbital of the electron barrier layer is energetically higher than the lowest unoccupied molecule orbital of the emitter layer. By arranging the energy level of the molecule orbitals of the hole barrier layer and/or the electron barrier layer according to the invention, barriers can be erected that prevent an unwanted injection of charge carriers from flowing in the wrong direction during re-emissive operation of the display.

To sufficiently suppress the unwanted dark current, it is advantageous to energetically match the conduction band or LUMO (lowest unoccupied molecule orbital) of the hole barrier layer to the LUMO of the emitter layer as well as to match the valence band or the highest occupied molecule orbital (HOMO) of the electrode barrier layer to the HOMO of the emitter layer. This enables the charge carriers, that are created in the emitter layer during re-emissive operation, to drain without barriers.

The invention is not limited to the exemplary embodiments illustrated herein. Furthermore, it is possible to make various modifications, additions and substitutions, without departing from the scope and spirit of the invention.

What is claimed is:

1. A display based on a photoluminescence quenching device (PQD), the display comprising:
   a substrate;
   an emitter layer;
   a first electrode layer, which is transparent and is arranged on a front side of the emitter layer;
   a second electrode layer, which is disposed on the backside of the emitter layer; and
   an electron barrier layer comprising phenylenediamine derivatives and a hole barrier layer where the hole barrier layer and the electron barrier layer are respectively disposed between the emitter layer and one of the first electrode layer and second electrode layer, wherein a highest occupied molecule orbital of the hole barrier layer is energetically lower than a highest occupied molecule orbital of the emitter layer and a lowest unoccupied molecule orbital of the electron barrier layer is energetically higher than a lowest unoccupied molecule orbital of the emitter layer,
   wherein the lowest unoccupied molecule orbital of the emitter layer corresponds to the lowest unoccupied molecule orbital of the hole barrier layer and the highest occupied molecule orbital of the electron baffler layer corresponds to the highest occupied molecule orbital of the emitter layer, whereby the first electrode layer forms a cathode and the second electrode layer forms an anode during re-emissive operation of the display, and the first electrode layer forms the anode and the second electrode layer forms a cathode during emissive operation of the display; and
   wherein the hole barrier layer comprises at least one compound selected from a group consisting of oxadiazole derivatives, oxazole derivatives, triazole derivatives and quinoxaline derivatives and/or at least one compound selected from a group consisting of naphthalene carboxylic acid imide derivatives, naphthalene dicarboxylic acid diimide derivatives and wide-bandgap inorganic semiconductors.

2. The display of claim 1, wherein an energy difference between the highest occupied molecule orbital of the electron barrier layer and the lowest unoccupied molecule orbital of the electron barrier layer and an energy difference between the highest occupied molecule orbital of the hole barrier layer and the lowest unoccupied molecule orbital of the hole barrier layer each amount to at least about 3.3 eV.

3. The display of claim 1, wherein the hole barrier layer is at least one of tin oxide, titanium oxide, zinc oxide, zirconium oxide, tantalum oxide, zinc sulphide and zinc selenide.

4. The display of claim 1, wherein the hole barrier layer is disposed on a side of the emitter layer that faces towards the substrate and the electron barrier layer is disposed on a side of the emitter layer that faces away from the substrate.

5. A photoluminescence quenching device (PQD), comprising an organic light emitting material;
a first electrode which is transparent and is located on a front side of the organic light emitting material; and
a second electrode which is located on a back side of the organic light emitting material wherein the PQD comprises an electron barrier layer comprising phenylenediamine derivatives and a hole barrier layer disposed between the light emitting material and one of the first electrode or the second electrode, respectively, and a highest occupied molecule orbital of the light emitting material and a lowest occupied molecule orbital of the electron barrier layer is energetically higher than a lowest unoccupied molecule orbital of the light emitting material,
wherein the lowest unoccupied molecule orbital of the light emitter material corresponds to the lowest unoccupied molecule orbital of the hole barrier layer and the highest occupied molecule orbital of the electron barrier layer corresponds to the highest occupied molecule orbital of the emitter material, whereby the first electrode forms a cathode and the second electrode forms an anode during re-emissive operation of the PQD and the first electrode forms the anode and the second electrode forms the cathode during emissive operation of the PQD; and
wherein the hole barrier layer comprises at least one compound selected from a group consisting of oxadiazole derivatives, oxazole derivatives, triazole derivatives and quinoxaline derivatives and/or at least one compound selected from a group consisting of naphthalene carboxylic acid imide derivatives, naphthalene dicarboxylic acid diimide derivatives and wide-bandgap inorganic semiconductors.

6. The PQD of claim 5, wherein an energy difference between the highest occupied molecule orbital of the electron barrier layer and the lowest unoccupied molecule orbital of the electron barrier layer and an energy difference between the highest occupied molecule orbital of the hole barrier layer and the lowest unoccupied molecule orbital of the hole barrier layer each amounts to at least about 3.3 eV.

7. The display of claim 5, wherein the hole barrier layer is at least one of tin oxide, titanium oxide, zinc oxide, zirconium oxide, tantalum oxide, zinc sulphide and zinc selenide.

* * * * *